United States Patent [19]

Gorecki

[11] Patent Number: 5,666,087

[45] Date of Patent: Sep. 9, 1997

[54] ACTIVE RESISTOR FOR STABILITY COMPENSATION

[75] Inventor: James L. Gorecki, Hillsboro, Oreg.

[73] Assignee: Lattice Semiconductor Corp., Hillsboro, Oreg.

[21] Appl. No.: 635,184

[22] Filed: Apr. 25, 1996

Related U.S. Application Data

[60] Division of Ser. No. 403,352, Mar. 14, 1995, which is a continuation-in-part of Ser. No. 396,994, Mar. 1, 1995.

[51] Int. Cl.$^6$ ............................................................ H03F 3/45
[52] U.S. Cl. ........................................... 330/260; 330/85
[58] Field of Search .................................. 330/69, 85, 259, 330/260, 261

[56] References Cited

U.S. PATENT DOCUMENTS

| | | | |
|---|---|---|---|
| 4,088,962 | 5/1978 | Trilling | 330/85 X |
| 4,594,558 | 6/1986 | Congdon | 339/9 |
| 4,667,166 | 5/1987 | Yasuhiro | 330/260 |
| 5,107,146 | 4/1992 | El-Ayat | 307/465 |
| 5,148,121 | 9/1992 | Noriaki | 330/295 |
| 5,157,350 | 10/1992 | Rubens | 330/254 |
| 5,283,483 | 2/1994 | Laber et al. | 307/520 |
| 5,361,042 | 11/1994 | Gist | 330/261 |

FOREIGN PATENT DOCUMENTS

| | | |
|---|---|---|
| 0 492 431 | 7/1992 | European Pat. Off. |
| 0 510 704 | 10/1992 | European Pat. Off. |
| 62-2411421 | 3/1986 | Japan |
| WO-A-9422216 | 9/1994 | WIPO |

OTHER PUBLICATIONS

IEEE Journal of Solid-State Circuits, vol. 28, No. 12, 1 Dec. 1993, pp. 1254–1263, XP000435898 Moon U —K et al: "Design of a Low–Distortion 22–KHz Fifth–Order Bessel Filter" see p. 1257, right–hand column, line 15–p. 1263, left–hand col., line 2; figures 4,9.

Electronic Design, Hasbrouck Heights, NJ, US, vol. 36, No. 23, 13 Oct. 1988, pp. 149–154, XP000001312 Goodenough F: "Mixed–Mode Arrays Give Designers Options" see p. 149—p. 152, figures 1,2.

IEEE Inernational Solid State Circuits Conference, vol. 35, 1 Feb. 1992, pp. 66–67, 245, XP000315424, Steyaert M et al: "A 10.7MHZ CMOS OTA–R–C Bandpass Filter with 68DB Dynamic Range and On–Chip Automatic Tuning" see p. 66—p. 67; figure 3.

Electronics Letters, vol. 23, No. 14, 2 Jul. 1987, Stevenage GB, pp. 742–743, XP002006844 P.J. Ryan D.G. Haigh: "Novel Fully Differential Mos Transconductor for Integrated Continuous–Time Filters" see p. 743; figure 2.

EDN Electrical Desiin News, vol. 32, No. 2, 22 Jan. 1987, Newton, Massachusetts US, pp. 181–184, XP002006806; A. Kaniel: "Flexible PGA Designs Require Few Components", see p. 183—p. 184; figure 2A.

Electronic Design, vol. 37, No. 13, 22 Jun. 1989, pp. 7–80, XP000033105, Moore S: "Simplify Signal Conditioning and Routing", see p. 78, figure 2.

*Primary Examiner*—Steven Mottola
*Attorney, Agent, or Firm*—Skjerven, Morrill, MacPherson, Franklin & Friel LLP; Stephen A. Terrile

[57] ABSTRACT

An active termination resistor is provided within a feedback loop circuit thus advantageously increasing the stability of the feedback loop circuit. In particular, the active termination resistor traces the impedance of the feedback loop such that $R(f) \equiv 1/GM3(f)$. The active resistor may also be configured to track the value of the resistor to set the feedback transconductance over process and temperature variations to ensure stability of the feedback loop over these variations.

16 Claims, 2 Drawing Sheets

ACTIVE RESISTOR FOR STABILITY COMPENSATION

CROSS REFERENCE TO RELATED APPLICATION

This application is a division of application Ser. No. 08/403,352, filed Mar. 14, 1995, which is a continuation in part of copending, commonly assigned U.S. patent application Ser. No. 08/396,994, filed on Mar. 1, 1995.

BACKGROUND OF THE INVENTION

The present invention relates to the use of active resistors in the control of the loop gain of an active circuit.

It is known to provide a gain circuit using input transconductors in combination with an amplifier. A transconductor is a circuit which receives an input voltage and generates an output current. The magnitude of the output current of the transconductor is proportional to the input voltage received. The ratio by which the output current changes for a given ratio of input voltage change is known as the conversion gain, or transconductance (GM), of the transconductor. A differential transconductor receives a differential voltage impressed between two input terminals (ignoring the common-mode voltage) and generates a differential current on two current output terminals.

FIG. 1, labeled prior art, shows an example of a circuit which performs a gain or filter function. The circuit includes an input transconductor (GM1) which converts the voltage received at its input to a differential current at its outputs, an amplifier (A), which amplifies the signal provided by the input transconductor, feedback resistors (RF1 and RF2), feedback capacitors (CF1 and CF2) and a termination resistor (R), which is provided at the input of the summation amplifier. Such a circuit may be used as a gain or filter stage in more complex linear circuitry.

For stability, the magnitude of the loop gain of a circuit must be less than one before the phase shift around the loop exceeds 360°. In the case of the FIG. 1 circuit, if the output impedance of amplifier A is much less than the value of the resistors RF1, RF2, then the loop gain is equal to the open loop gain of amplifier A. Thus, if amplifier A is stable, the loop gain the circuit including feedback resistors RF1, RF2, feedback capacitors CF1, CF2 and input transconductor GM is stable.

SUMMARY OF THE INVENTION

It has been discovered that providing an active termination resistor to a feedback loop circuit which includes a feedback transconductor advantageously increases the stability of the feedback loop circuit. In particular, stability is increased by causing resistance of the active termination resistor to track the transconductance of the feedback transconductor over process and temperature such that the resistance of the termination resistor is equal to or less than the inverse of the transconductance of the feedback transconductor. I.e., $R_{term} \cong 1/GM_{feedback}$.

Such an active resistor advantageously provides a reduction in the area needed to stabilize a gain stage over the use of a passive resistor connected between the input nodes of an amplifier. This invention is especially advantageous in situations where low frequency poles are required because the area required to implement a passive termination resistor in an integrated circuit could be prohibitive to the implementation of such an integrated circuit.

DETAILED DESCRIPTION

The following sets forth a detailed description of the best contemplated mode for carrying out the invention. The description is intended to be illustrative of the invention and should not be taken to be limiting.

Figure 1:
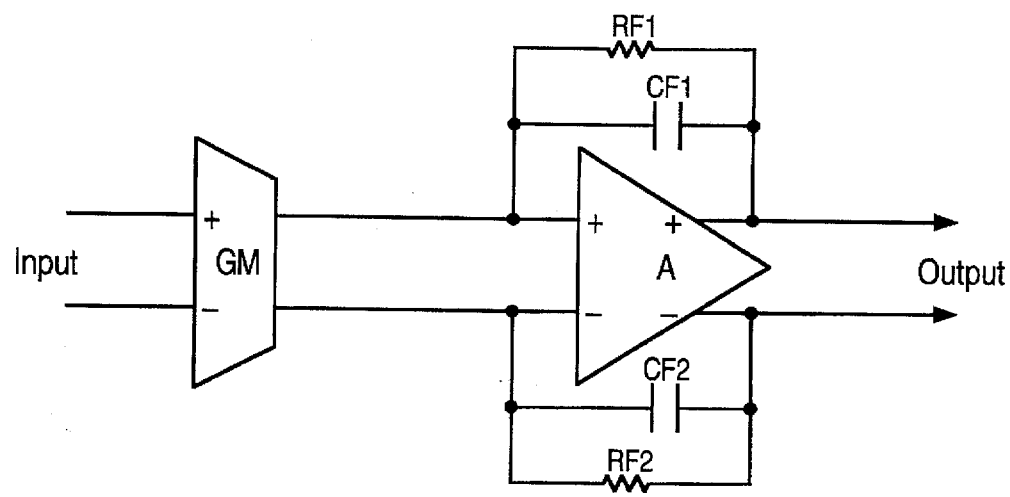
FIG. 1, labeled prior art, shows a schematic block diagram of a typical feedback loop circuit.
Figure 2:
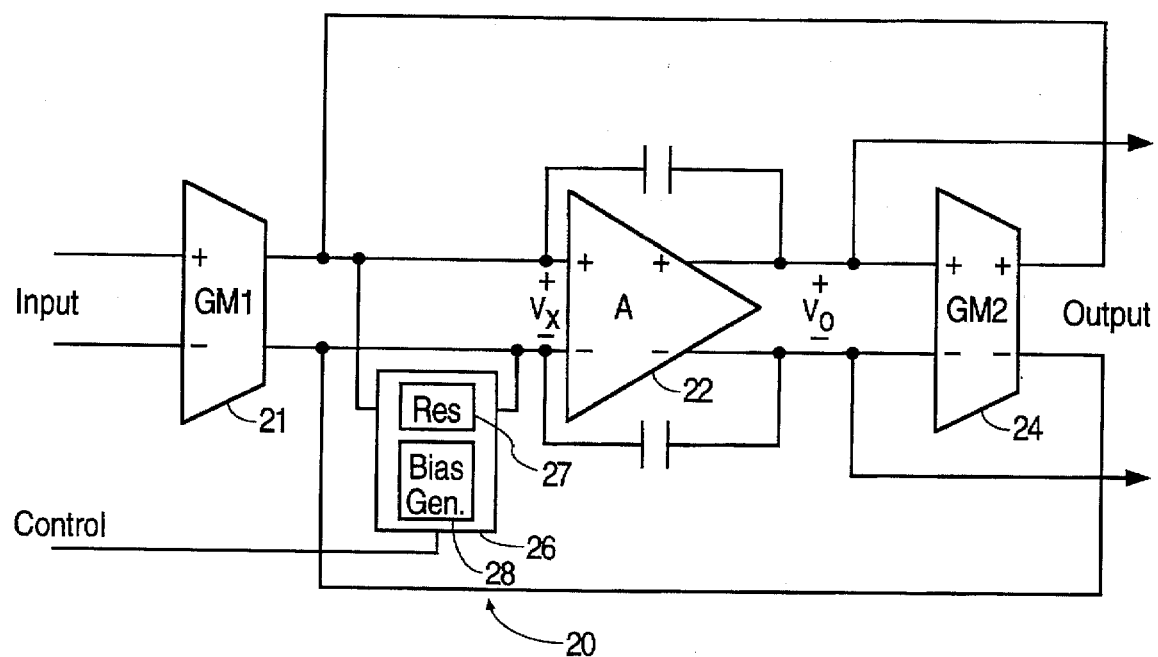
FIG. 2 shows a schematic block diagram of a feedback loop circuit which includes an active termination resistor in accordance with the present invention.

Referring to FIG. 2, feedback loop circuit 20 includes input transconductor 21 (GM1), amplifier 22 (A), feedback transconductor 24 (GM2), and active termination resistor circuit 26 coupled across the input terminals of amplifier 22. Active termination resistor circuit 26 includes active resistor 27 and termination resistor bias generator 28. Input transconductor 21 receives a differential input signal and provides a differential current to the inverting and non-inverting input terminals of amplifier 22. Amplifier 22 provides a differential output voltage signal as well as the input signal to feedback transconductor 24. Feedback transconductor 24 provides a differential feedback signal to the input terminals of amplifier 22 proportional to the voltage output of amplifier 22.

The input terminals of amplifier 22, across which active termination resistor circuit 26 is coupled, functions as virtual grounds by virtue of the high gain of amplifier 22 and the feedback paths from feedback transconductor 24 to the input terminals of amplifier 22. With a virtual ground, the voltage difference at the input of amplifier 22, $V_x$, is represented by the equation $$V_x = \frac{V_o}{A}$$

where A is the open loop gain of amplifier 22 and $V_o$ is the output voltage of amplifier 22.

Termination resistor bias generator 28 generates voltages to control the resistance of active resistor 27 such that the resistance tracks resistance of the resistor which is used to establish the transconductance of feedback transconductor 24.

The loop gain of feedback loop circuit 20 is equal to the open loop gain of amplifier 22 multiplied by the transconductance of feedback transconductor 24 multiplied by the resistance ($R_{eff}$) which is provided by the parallel combination of output resistance of transconductor 24 and the resistance of active termination circuit 26. More specifically, the loop gain of feedback loop circuit 20 is set forth by the equation $$LoopGain = A(f) \cdot GM2(f) \cdot R_{eff}$$

where, $R_{eff}$, which represents the effective resistance of the feedback loop, is set forth by the equation $$R_{eff} = \frac{R_{term} \cdot R_o}{R_{term} + R_o}$$

and $R_o$ equals the output resistance of feedback transconductor 24.

In the case that the terminator is removed from the open loop gain circuit 20, $R_{eff}$ is simply equal to the output resistance of transconductor 24, which is very high, e.g., >100 Mohms. Thus, the loop gain of the circuit is very high and the circuit is nearly impossible to stabilize. By adding active termination resistor 26 to circuit 20, the effective resistance is essentially the resistance of active termination resistor 26. If the resistance of active termination resistor 26 is equal to the inverse of the transconductance of feedback transconductor 24, then the loop gain is equal to the gain of amplifier 22. In this condition, when the amplifier is stable, the open loop circuit 20 is stable. The stability of the feedback loop may be arbitrarily increased by lowering the resistance of active resistor 27. However, lowering the resistance of active resistor 27 below the inverse of the transconductance of transconductor 24 increases systematic offset and distortion within open loop gain circuit 20.

Figure 3:
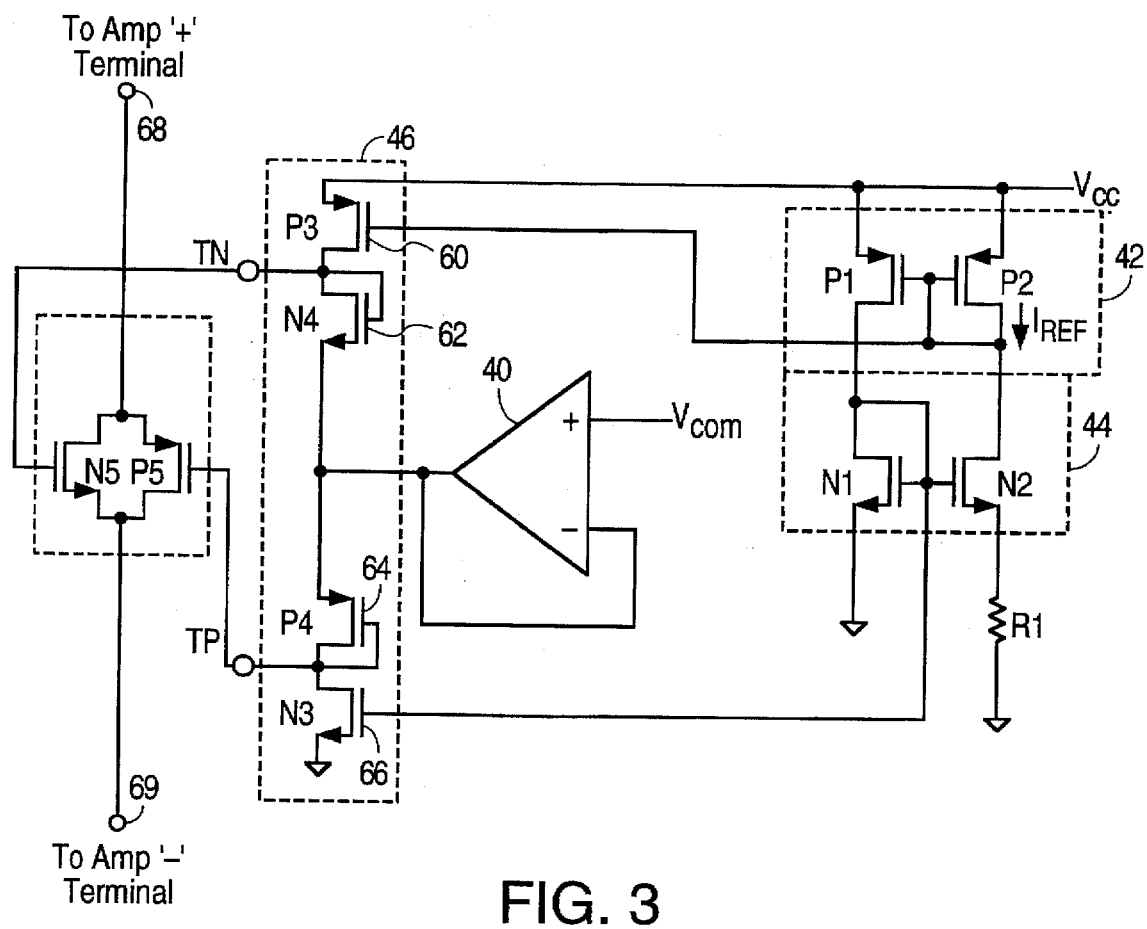
FIG. 3 shows a schematic block diagram of an active resistor along with an active resistor bias generator in accordance with the present invention.

Referring to FIG. 3, active termination resistor 27 includes P channel metal oxide semiconductor (PMOS) transistor 30 and N channel metal oxide semiconductor (NMOS) transistor 32, which are referred to as transistors P5 and N5, respectively. Transistors 30, 32 are biased to operate in their linear region by the TN and TP output signals of termination resistor bias generator 28.

Termination resistor bias generator 28 includes amplifier 40, current mirror 42, current mirror circuit 44 as well as bias circuit 46. Termination resistor bias generator 28 also includes bias resistor 58, which is referred to as resistor R1. Current mirrors 42 and 44 along with bias resistor 58 provide a current bias generator. Current mirror 42 includes PMOS transistors 50, 52, which are referred to as transistors P1 and P2, respectively. Current mirror 44 includes NMOS transistors 54, 56, which are referred to as transistors N1 and N2, respectively. Bias circuit 46 includes transistors 60, 62, 64, 66, which are referred to as P3, N4 and P4, N3, respectively.

Transistors P1 and P2 are the same size and thus provide a 1:1 current mirror. The current, $I_{ref}$, which is provided by the drains of transistors P1 and P2, is determined by transistors N1, N2 and resistor R1. More specifically, the current $I_{ref}$ is determined by the difference in the gate length and width of transistors N1 and N2, the mobility and gate oxide thickness of transistors N1 and N2 and the resistance of resistor R1.

In the preferred embodiment, the width versus length (W/L) ratios of transistors P1, P2 and P3 are equal as are the W/L ratios of transistors N1 and N3. The W/L ratio of transistor N2 is greater than the W/L ratio of transistor N1. Accordingly, the current $I_{ref}$ flows in all circuit legs as shown by the following equation.

$$I_{ref} = \frac{M}{R1^2}$$

where $$M = \left[ \frac{1}{\sqrt{K_{N1}}} - \frac{1}{\sqrt{K_{N2}}} \right]^2$$

and $$K_{dy} = \frac{\mu_{dy} \cdot C_{ox} \cdot W_{dy}}{2 \cdot L_{dy}}$$

Where $\mu_d$ represents the mobility of the majority carriers, $C_{ox}$ is the capacitance per unit area of the gate of the referenced transistor, $W_{dy}$ is the gate width of the referenced transistor, $L_{dy}$ is the gate length of the referenced transistor and the subscript dy is a variable which represents the particular transistor, e.g., $K_{N1}$ is the equation for transistor N1.

Termination resistor circuit 26, also includes a common mode feedback circuit (not shown) which forces a common mode loop voltage to $V_{com}$ at the input terminals of summation amplifier 22. By virtue of the virtual ground between the input terminals of amplifier 22, the differential voltage on the input terminals of amplifier 22 is a very small value ($V_x = V_o/A(f)$). Accordingly, the transistors of termination resistor circuit 26 effectively have the voltage $V_{com}$ on both the drain and source terminals.

In operation, transistor N5 is operating in its linear region of operation when terminals 68 and 69 are held to the common mode reference voltage $V_{com}$. Accordingly, its drain to source resistance, $R_{ds}$, is $$R_{ds} = \frac{1}{K_{N5}(TN - V_{com} - V_{TN5})}$$

where the voltage TN is defined by the equation:

$$TN = VT_{N4} + V_{com} + \sqrt{\frac{M}{R1^2 \cdot K_{N4}}}$$

substituting the derivation for the voltage TN in the equation for $R_{ds}$ yields $$R_{ds} = \frac{R1}{K_{N5} \cdot \sqrt{\frac{M}{K_{N4}}}}$$

Likewise, in operation, transistor P5 is operating in its linear region of operation when terminals 68 and 69 are held to the common mode reference voltage Vcom. Accordingly, its drain to source resistance, $R_{ds}$, is $$R_{ds} = \frac{1}{K_{P5}(TP - V_{com} - V_{TP5})}$$

where the voltage TP is defined by the equation:

$$TP = V_{com} + VT_{P5} + \sqrt{\frac{M}{R1^2 \cdot K_{P4}}}$$

substituting the derivation for the voltage TP in the equation for $R_{ds}$ yields $$R_{ds} = \frac{R1}{K_{P5} \cdot \sqrt{\frac{M}{K_{P4}}}}$$

Accordingly, the value $R_{ds}$ is dependent directly upon the value of bias resistor R1. For the N channel transistors, the mobility variations cancel and the remaining terms provide a scale constant dependent upon the geometry's (i.e., the W/L ratio) of transistors N1, N2, N4, and N5. For the P channel transistors, the mobility variations substantially cancel and the remaining terms provide a scale constant dependent upon the geometry's of transistors P1, P2, P4 and P5. These geometry's are constant for a particular active resistor circuit.

The final $P_{ds}$ of active resistor circuit 26 is actually the effective resistance of the parallel $R_{ds}$'s of P5 and N5. Two devices are provided to address power-up transients that might be present when a single N or P device is activated.

The same type of passive resistor that is used to determine the GM of the feedback transconductor 24 is also used for R1 in the current bias generator to ensure that the effective $R_{ds}$ which is provided by the parallel drain to source resistances of P5 and N5 is equal to 1/GM3. In practice, $R_{ds}$ is set slightly lower, e.g., about 10% lower, to provide additional stability to compensate for the excess phase shift in feedback transconductor 24.

Other Embodiments

Other embodiments are within the following claims.

For example, while two devices, P5 and N5, are shown in the preferred embodiment, only one device is necessary to form Rds. Alternately, other combinations of active resistors may be provided or parallel or in series to aid in programmability of the loop gain of the feedback loop circuit 20 and thus provide programmable stability.

Figure 4:
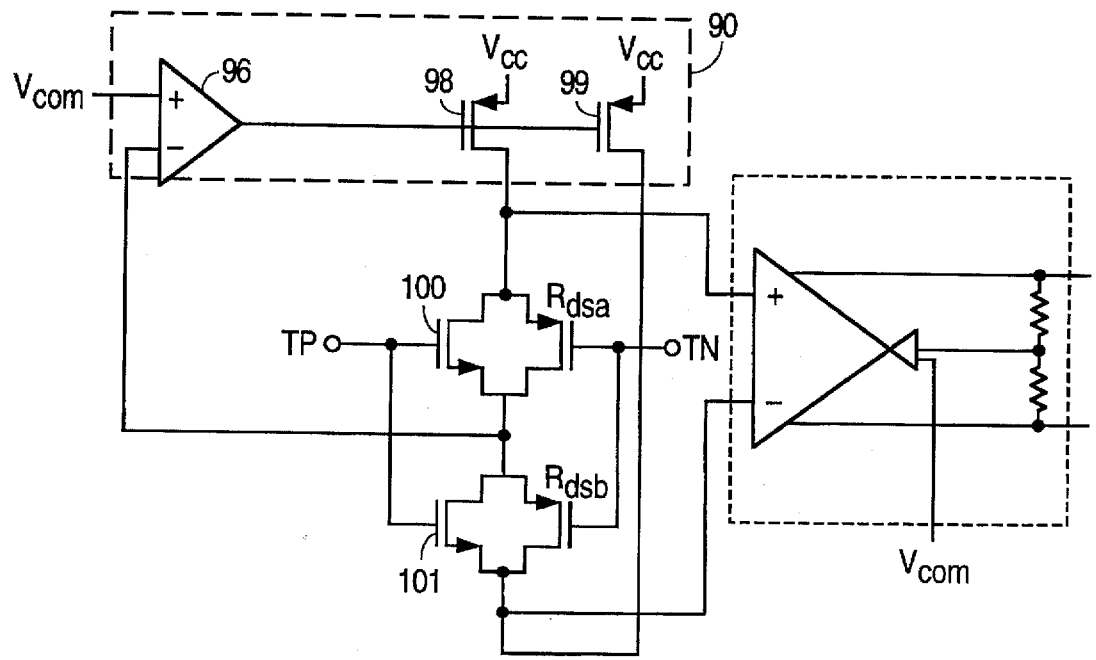
FIG. 4 shows a schematic block diagram of an alternate active termination resistor in accordance with the present invention.

Also for example, referring to FIG. 4, an alternate active resistor circuit may be provided. Such an active resistor circuit would be preferable for use with a common mode feedback circuit 90. Common mode feedback circuit 90 ensures that the common mode voltage at the amplifier input terminals is equal to a reference common mode voltage Vcom. More specifically, the common mode feedback circuit 90 supplies identical currents which are provided to balance the common mode output current of the transconductors. Amplifier 96 senses the common mode voltage by sensing the difference between the differential amplifier inputs terminals and compares it to the common mode reference voltage and provides a common gate voltage to transistors 98, 99 thereby supplying a common mode current such that the common mode voltage at the amplifier inputs is equal to the common mode reference voltage. The series combination of active resistors 100, 101 adds to provide the effective resistance Rds. I.e., $R_{dsa}+R_{dsb}=R_{ds}$.

Also for example, while the gain circuit is shown using differential components, it is well known that these components may also be configured as single ended components.

What is claimed is:

1. A circuit comprising
an amplifier, the amplifier including first and second amplifier input terminals and first and second amplifier output terminals, the first and second amplifier output terminals being coupled to the first and second amplifier input terminals to provide a virtual ground;
a feedback transconductor, the feedback transconductor including first and second feedback transconductor input terminals and first and second feedback transconductor output terminals, the first and second feedback transconductor input terminals being coupled to the first and second amplifier output terminals and the first and second feedback transconductor output terminals being coupled to the first and second amplifier input terminals, the feedback transconductor input terminals having a high input impedance and the feedback transconductor output terminal having a high output impedance, the feedback transconductor having a feedback transconductance;
a resistor circuit having a resistor circuit resistance and including first and second resistor circuit terminals, the first and second resistor circuit terminals being coupled to the first and second amplifier input terminals so as to reduce the loop gain of the circuit.

2. The circuit of claim 1 wherein
the resistor circuit resistance has a value at or below the inverse of the feedback transconductance thereby reducing the loop gain so as to control the stability of the circuit.

3. The circuit of claim 1 wherein
the resistor circuit includes a passive resistor.

4. A circuit comprising:
an amplifier, the amplifier including first and second amplifier input terminals and first and second amplifier output terminals, the first and second amplifier output terminals being coupled to the first and second amplifier input terminals to provide a virtual ground;
a feedback transconductor, the feedback transconductor including first and second feedback transconductor input terminals and first and second feedback transconductor output terminals, the first and second feedback transconductor input terminals being coupled to the first and second amplifier output terminals and the first and second feedback transconductor output terminals being coupled to the first and second amplifier input terminals, the feedback transconductor input terminals having a high input impedance and the feedback transconductor output terminal having a high output impedance, the feedback transconductor having a feedback transconductance;
a resistor circuit having a resistor circuit resistance and including first and second resistor circuit terminals, the first and second resistor circuit terminals being coupled to the first and second amplifier input terminals so as to reduce the loop gain of the circuit, the resistor circuit including a first transistor having first and second current handling terminals coupled to the first and second input terminals of the amplifier, the first transistor being biased to operate in a linear region.

5. The circuit of claim 4 wherein
the first transistor is a PMOS transistor.

6. The circuit of claim 4 wherein
the first transistor is an NMOS transistor.

7. The circuit of claim 4 wherein
the resistor circuit further includes a second transistor coupled to the virtual ground of the amplifier, the second transistor being biased to operate in a linear region;
the first transistor being a PMOS transistor and the second transistor being an NMOS transistor.

8. The circuit of claim 4 wherein
the active resistor includes a bias circuit,
the bias circuit generating a bias current, the bias current being related to a resistance value.

9. The circuit of claim 8 wherein
the bias circuit includes a bias resistor, the bias resistor providing a bias resistor resistance,
the bias current being dependent upon the square of the bias resistor resistance.

10. The circuit of claim 9 wherein
the bias circuit includes a second transistor having first and second current handling terminals and a control terminal, the second transistor first current handling terminal being biased with the bias current, the second transistor generating a bias voltage, the bias voltage biasing the first transistor.

11. The gain circuit of claim 10 wherein
the bias voltage is dependent linearly upon the absolute value of the bias resistor resistance and upon the bias transistor geometry and the first transistor geometry.

12. A circuit comprising:
an amplifier, the amplifier including first and second amplifier input terminals and first and second amplifier output terminals, the first and second amplifier output terminals being coupled to the first and second amplifier input terminals to provide a virtual ground;

a feedback transconductor, the feedback transconductor including first and second feedback transconductor input terminals and first and second feedback transconductor output terminals, the first and second feedback transconductor input terminals being coupled to the first and second amplifier output terminals and the first and second feedback transconductor output terminals being coupled to the first and second amplifier input terminals, the feedback transconductor input terminals having a high input impedance and the feedback transconductor output terminal having a high output impedance, the feedback transconductor having a feedback transconductance;

an active resistor circuit having a resistor circuit resistance and including first and second resistor circuit terminals, the first and second resistor circuit terminals being coupled to the first and second amplifier input terminals so as to reduce the loop gain of the circuit.

13. The circuit of claim 12 wherein the active resistor circuit resistance has a value at or below the inverse of the feedback transconductance thereby reducing the loop gain so as to control the stability of the circuit.

14. The circuit of claim 12 wherein the active resistor circuit includes a first transistor having first and second current handling terminals coupled to the first and second input terminals of the amplifier, the first transistor being biased to operate in a linear region.

15. The circuit of claim 14 wherein the active resistor circuit further includes a second transistor coupled to the virtual ground of the amplifier, the second transistor being biased to operate in a linear region;

the first transistor being a PMOS transistor and the second transistor being an NMOS transistor.

16. The circuit of claim 12 wherein the active resistor includes a bias circuit, the bias circuit generating a bias current, the bias current being related to a resistance value.

* * * * *

UNITED STATES PATENT AND TRADEMARK OFFICE
CERTIFICATE OF CORRECTION

PATENT NO.     : 5,666,087
DATED          : September 9, 1997
INVENTOR(S)    : James L. Gorecki It is certified that error appears in the above-identified patent and that said Letters Patent is hereby corrected as shown below:

Column 4, line 60, delete "$P_{ds}$" and insert --$R_{ds}$--.

Signed and Sealed this

Nineteenth Day of May, 1998

Attest:

BRUCE LEHMAN

*Attesting Officer*     *Commissioner of Patents and Trademarks*